United States Patent
Kawata et al.

(10) Patent No.: US 8,193,763 B2
(45) Date of Patent: Jun. 5, 2012

(54) BATTERY APPARATUS, BATTERY CONTROL APPARATUS, AND MOTOR DRIVE UNIT

(75) Inventors: Takahiro Kawata, Oume (JP); Akihiko Emori, Hitachi (JP); Youhei Kawahara, Hitachi (JP); Akihiko Kudo, Hitachinaka (JP)

(73) Assignee: Hitachi Vehicle Energy, Ltd., Hitachinaka-shi (JP)

( * ) Notice: Subject to any disclaimer, the term of this patent is extended or adjusted under 35 U.S.C. 154(b) by 0 days.

(21) Appl. No.: 13/024,739

(22) Filed: Feb. 10, 2011

(65) Prior Publication Data

US 2011/0187326 A1    Aug. 4, 2011

Related U.S. Application Data

(63) Continuation of application No. 12/018,966, filed on Jan. 24, 2008, now Pat. No. 7,911,178.

(30) Foreign Application Priority Data

Mar. 6, 2007    (JP) .................................. 2007-055516

(51) Int. Cl.
*H01M 10/46* (2006.01)
(52) U.S. Cl. ...................................... 320/107
(58) Field of Classification Search .................. 320/107, 320/114, 116, 128, 132, 149
See application file for complete search history.

(56) References Cited

U.S. PATENT DOCUMENTS

| | | | | |
|---|---|---|---|---|
| 6,337,628 | B2 * | 1/2002 | Campana, Jr. | 340/573.4 |
| 6,472,991 | B1 | 10/2002 | Schulman et al. | |
| 7,911,178 | B2 * | 3/2011 | Kawata et al. | 320/116 |

FOREIGN PATENT DOCUMENTS

| | | |
|---|---|---|
| JP | 1-265740 A | 10/1989 |
| JP | 2000-74786 A | 3/2000 |
| JP | 2000-299939 A | 10/2000 |
| JP | 2003-70179 A | 3/2003 |
| JP | 2005-318750 A | 11/2005 |
| JP | 2005-318751 A | 11/2005 |

* cited by examiner

*Primary Examiner* — Edward Tso
(74) *Attorney, Agent, or Firm* — Crowell & Moring LLP

(57) ABSTRACT

The present invention provides enhanced serial communication reliability in a situation where a plurality of cell controllers and a battery controller are daisy-chained to form a serial communication configuration. While the plurality of cell controllers and the battery controller are daisy-chained to form a serial communication configuration, the battery controller or each cell controller includes a communication speed detection means, which detects the communication speed of data input from an additional controller, and a reception timing correction means, which corrects the reception timing for data input from the additional controller in accordance with the communication speed detected by the communication speed detection means.

17 Claims, 6 Drawing Sheets

FIG.6
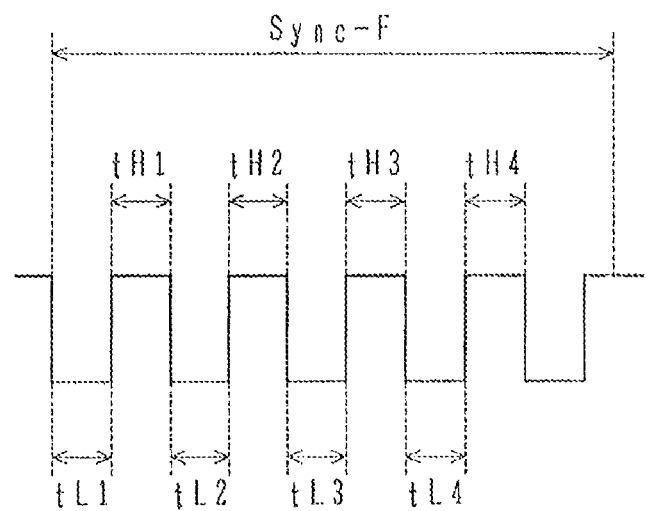
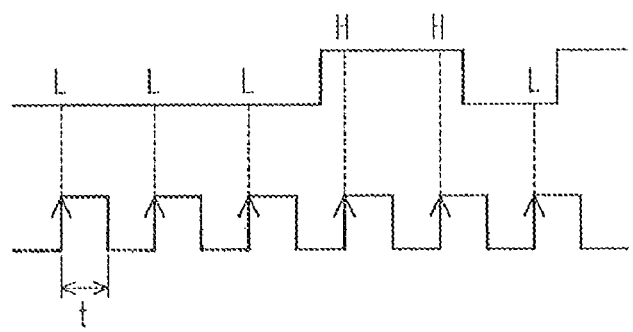
FIG.7A
FIG.7B

BATTERY APPARATUS, BATTERY CONTROL APPARATUS, AND MOTOR DRIVE UNIT

CROSS-REFERENCE TO RELATED APPLICATIONS

This application is a continuation of U.S. application Ser. No. 12/018,966 filed Jan. 24, 2008 now U.S. Pat. No. 7,911,178 and claims priority of Japanese patent application no. 2007-055516 filed Mar. 6, 2007.

BACKGROUND OF THE INVENTION

1. Field of the Invention

The present invention relates to a battery apparatus, battery control apparatus, and battery module control apparatus that manage the status of an in-vehicle or power supply secondary battery (lithium storage battery), and a motor drive unit that uses the battery apparatus. More particularly, the present invention relates to a battery apparatus, battery control apparatus, and motor drive unit that are suitable for use with a daisy chain of a plurality of cell controllers for managing battery cells which constitute a storage battery, and a battery controller which manages the entire storage battery.

2. Description of the Related Art

In a hybrid vehicle or electric vehicle, an assembled battery composed of a plurality of battery cells is used for a battery apparatus. The cells of the assembled battery are divided into groups of predetermined number of cells, which are called battery modules.

A conventional battery apparatus includes a plurality of series-connected battery modules to each of which a plurality of cells are series-connected, a plurality of low-level controllers (cell controllers) which are provided for each of the plurality of battery modules to control the plurality of cells constituting a battery module, and a high-level controller (battery controller) which controls the plurality of low-level controllers (cell controllers). Data is mutually exchanged between the cell controllers and the battery controller by means of serial communication.

There are various known battery apparatuses (disclosed, for instance, by JP-A-2000-74786, JP-A-2000-299939, JP-A-2003-70179, JP-A-2005-318750, and JP-A-2005-318751) that include a plurality of cell controllers and a battery controller, which are circularly connected (daisy-chained together) to establish serial communication.

SUMMARY OF THE INVENTION

When a plurality of cell controllers and a battery controller are daisy-chained together to establish serial communication between the controllers, the baud rate varies because a transmitting-end controller clock differs from a receiving-end controller clock. The baud rate also varies because the High and Low level periods of a signal deviate from normal due, for instance, to interference with a serial communication signal waveform edge or different threshold values for High and Low signal levels.

The degree of above-mentioned serial communication baud rate variations increases when a plurality of cell controllers are daisy-chained together. If a serial communication signal returns to the battery controller with the degree of variations increased, the resulting baud rate differs from the baud rate of a transmission from the battery controller to the cell controllers. This may cause an erroneous bit read and reception error.

It is an object of the present invention to provide a battery apparatus, battery control apparatus, and motor drive unit that are capable of properly establishing serial communication even when a plurality of cell controllers and a battery controller are daisy-chained to form a serial communication configuration.

(1) In accomplishing the above object, according to one aspect of the present invention, there is provided a battery apparatus including: a battery module to which a plurality of assembled batteries are series-connected while a plurality of battery cells are series-connected to each of the plurality of assembled batteries; a battery cell control apparatus that is provided for each of the plurality of assembled batteries and equipped with a plurality of control circuits, which control the plurality of battery cells of the associated assembled battery; and a battery control apparatus for managing the battery module. The plurality of control circuits and the battery control apparatus are circularly connected. Each of the plurality of control circuits or the battery control apparatus includes a communication speed detection means for detecting the communication speed of data input from an additional control apparatus or an additional control circuit, and a reception timing correction means for correcting the reception timing for data input from an additional control apparatus or an additional control circuit in accordance with the communication speed detected by the communication speed detection means.

As the present invention is configured as described above, it can establish proper serial communication even when a plurality of battery module control apparatuses and the battery control apparatus are daisy-chained to form a serial communication configuration.

(2) According to another aspect of the present invention, there is provided the battery apparatus as described in (1) above, wherein each of the plurality of control circuits detects the storage status of the plurality of cells of the associated assembled battery, and transmits the detected storage status to the battery control apparatus by means of serial communication.

(3) According to another aspect of the present invention, there is provided the battery apparatus as described in (2) above, wherein the storage status includes at least information about a voltage of each of the plurality of battery cells and information about the existence of abnormality in each of the plurality of battery cells; and wherein the battery control apparatus alternately receives the information about a voltage of each of the plurality of battery cells and the information about the existence of abnormality in each of the plurality of battery cells from the control circuits by means of serial communication.

(4) In accomplishing the above object, according to another aspect of the present invention, there is provided a battery control apparatus that is mounted in a battery apparatus to manage a battery module, wherein the battery apparatus includes a battery module to which a plurality of assembled batteries are series-connected while a plurality of battery cells are series-connected to each of the plurality of assembled batteries, and a battery cell control apparatus that is provided for each of the plurality of assembled batteries and equipped with a plurality of control circuits which control the plurality of battery cells of the associated assembled battery, and wherein the plurality of control circuits and the battery control apparatus are circularly connected. The battery control apparatus includes: a communication speed detection means for detecting the communication speed of data input from the control circuits; and a reception timing correction means for correcting the reception timing for data input from an additional control apparatus or an additional control circuit in accordance with the communication speed detected by the communication speed detection means.

As the present invention is configured as described above, it can establish proper serial communication even when a plurality of battery module control apparatuses and the battery control apparatus are daisy-chained to form a serial communication configuration.

(5) In accomplishing the above object, according to another aspect of the present invention, there is provided a battery control apparatus that is mounted in a battery apparatus having a battery module to which a plurality of assembled batteries are series-connected while a plurality of battery cells are series-connected to each of the plurality of assembled batteries, and a battery control apparatus for managing the battery module, is provided for each of the plurality of assembled batteries, and is equipped with a plurality of control circuits for controlling the plurality of battery cells of the associated assembled battery, wherein the plurality of control circuits and the battery control apparatus are circularly connected. The battery control apparatus includes: a communication speed detection means for detecting the communication speed of data input from the battery control apparatus or an additional control circuit; and a reception timing correction means for correcting the reception timing for data input from an additional control apparatus or an additional control circuit in accordance with the communication speed detected by the communication speed detection means.

As the present invention is configured as described above, it can establish proper serial communication even when a plurality of battery module control apparatuses and the battery control apparatus are daisy-chained to form a serial communication configuration.

(6) In accomplishing the above object, according to still another aspect of the present invention, there is provided a motor drive unit including: a battery apparatus that includes a battery module to which a plurality of assembled batteries are series-connected while a plurality of battery cells are series-connected to each of the plurality of assembled batteries, a battery cell control apparatus which is provided for each of the plurality of assembled batteries and equipped with a plurality of control circuits for controlling the plurality of battery cells of the associated assembled battery, and a battery control apparatus for managing the battery module; a controller for controlling the electrical power supplied from the battery apparatus; and a motor that receives the electrical power controlled by the controller and generates rotation power. The battery apparatus, in which the plurality of control circuits and the battery control apparatus are circularly connected, is such that each of the plurality of control circuits or the battery control apparatus includes a communication speed detection means for detecting the communication speed of data input from an additional control apparatus or an additional control circuit, and a reception timing correction means for correcting the reception timing for data input from the additional control apparatus or the additional control circuit in accordance with the communication speed detected by the communication speed detection means.

As the present invention is configured as described above, it can establish proper serial communication even when a plurality of battery module control apparatuses and the battery control apparatus are daisy-chained to form a serial communication configuration.

The present invention can establish proper serial communication even when a plurality of cell controllers and a battery controller are daisy-chained to form a serial communication configuration.

BRIEF DESCRIPTION OF THE DRAWINGS

FIG. 6 illustrates the operation of a communication speed detection section for use in the battery controller of the battery apparatus according to an embodiment of the present invention.

FIGS. 7A and 7B illustrate the operation of a reception timing correction section for use in the battery controller of the battery apparatus according to an embodiment of the present invention.

DETAILED DESCRIPTION OF THE PREFERRED EMBODIMENTS

The configuration and operation of a battery apparatus according to an embodiment of the present invention will now be described with reference to FIGS. 1 to 8.

First of all, the overall configuration of the battery apparatus according to the present embodiment of the present invention will be described with reference to FIG. 1.

Figure 1:
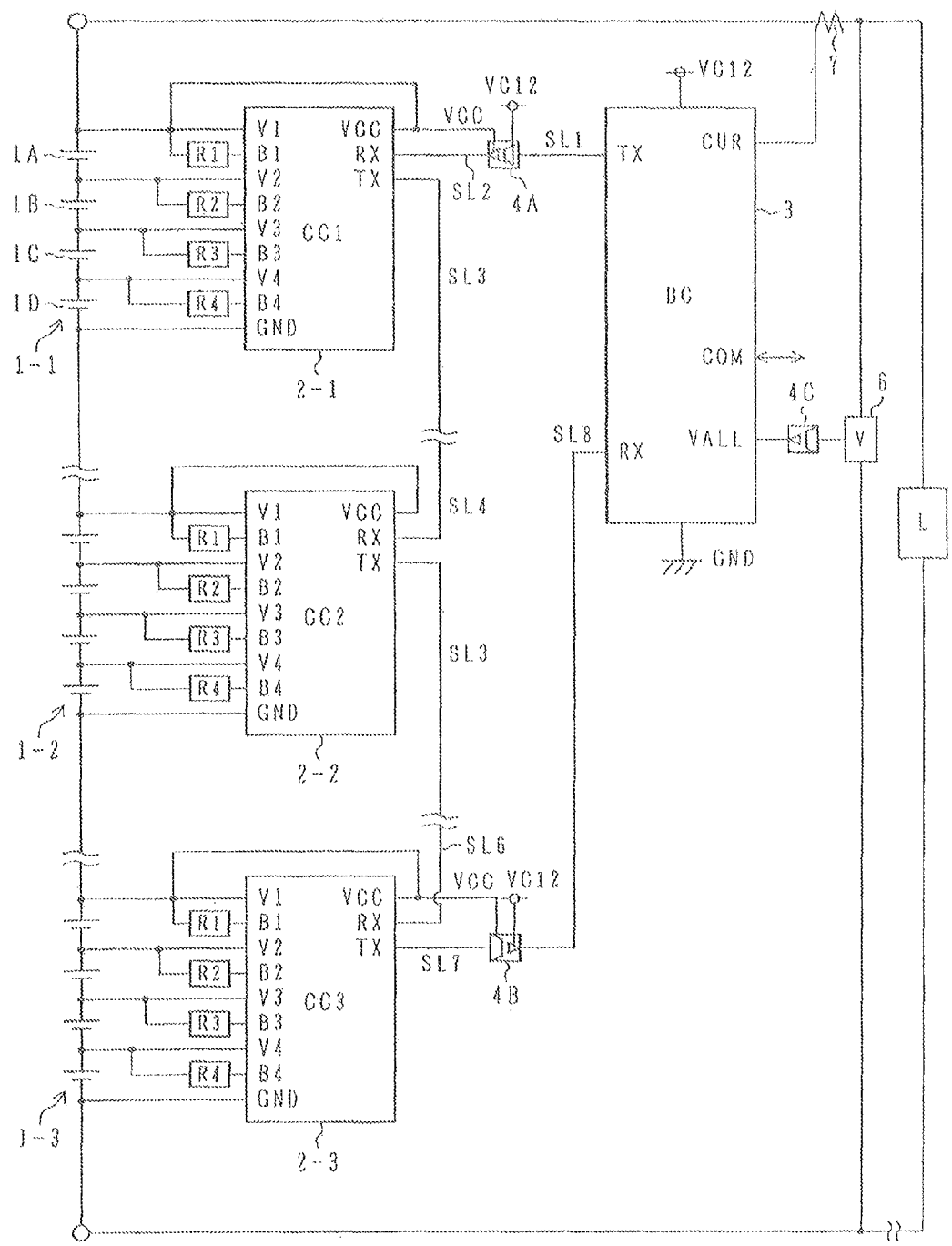
FIG. 1 is a block diagram illustrating the overall configuration of a battery apparatus according to an embodiment of the present invention.

FIG. 1 is a block diagram illustrating the overall configuration of the battery apparatus according to an embodiment of the present invention.

Referring to FIG. 1, four battery cells 1A, 1B, 1C, 1D are series-connected to constitute one unit, which is called a unit battery cell (assembled battery) 1-1. For example, lithium batteries are used as the battery cells 1A, 1B, 1C, 1D. In such a case, the voltage of each battery cell 1A, 1B, 1C, 1D is 3.6 V. Therefore, the voltage of the unit battery cell 1-1 is 14.4 V.

Although FIG. 1 shows that three unit battery cells 1-1, 1-2, 1-3 are series-connected, the actual number of connected unit battery cells 1 is, for example, 12. Twelve series-connected unit battery cells 1 constitute a battery module. In this case, the voltage of the battery module is approximately 170 V. When, for instance, a voltage of 300 V or higher is needed, two battery modules are series-connected.

Cell controller (CC) 2-1 is provided for unit battery cell 1-1. Cell controller 2-1 monitors unit battery cell 1-1. Cell controllers 2-2 and 2-3 monitor unit battery cells 1-2 and 1-3. Input terminals V1, V2, V3, V4 of cell controller 2-1 are connected to the positive terminals of the battery cells 1A, 1B, 1C, 1D of unit battery cell 1-1. An input terminal ground GND of cell controller 2-1 is connected to the negative terminal of battery cell 1D. Input terminals B1, B2, B3, B4 of cell controller 2-1 are connected to the positive terminals of the battery cells 1A, 1B, 1C, 1D of unit battery cell 1-1 through resistors R1, R2, R3, R4. A power supply terminal VCC of cell controller 2-1 is connected to the positive terminal of battery cell 1A.

A signal output terminal TX of a battery controller 3 is connected to a signal input terminal RX of cell controller 2-1 through a photocoupler or other insulation section 4A and serial communication lines SL1, SL2. The signal input terminal RX of cell controller 2-2 is connected to a signal output terminal TX of cell controller 2-1 through serial communication lines SL3, SL4. A signal input terminal RX of cell controller 2-3 is connected to a signal output terminal TX of cell controller 2-2 through serial communication lines SL5, SL6. A signal input terminal RX of the battery controller 3 is connected to a signal output terminal TX of cell controller 2-3 through a photocoupler or other insulation section 4B and serial communication lines SL7, SL8.

As described above, the battery controller 3 and a plurality of cell controllers 2-1, 2-2, 2-3 are circularly connected, that is, daisy-chained, to form a serial communication configuration.

A cell controller 2 is provided for each unit battery cell, which includes four battery cells. Three cell controllers are shown in FIG. 1. However, many cell controllers are provided between the cell controllers. An appropriate number of cell controllers are provided so as cover all lithium battery cells, which are divided into groups of four lithium battery cells.

FIG. 1 shows that a cell controller 2-1 is provided for a unit battery cell 1-1, which is formed by series-connecting four battery cells 1A, 1B, 1C, 1D. However, the present invention is not limited to the use of a cell controller that covers four battery cells. An alternative is to use a cell controller that covers, for instance, six or eight battery cells.

A voltage detection section 6 detects the overall voltage of a battery module that includes series-connected unit battery cells 1-1, 1-2, 1-3. The detected voltage is input to a voltage input terminal VALL of the battery controller 3 through a photocoupler or other insulation section 4C. A current detection section 7 detects a current flow to the battery module that includes series-connected unit battery cells 1-1, 1-2, 1-3. The battery controller 3 inputs the detected current to a current input terminal CUR.

The battery controller 3 has a communication terminal COM. The battery controller 3 reports the status of the battery module to a higher-level controller through the communication terminal COM.

A load L is connected to the battery module that includes series-connected unit battery cells 1-1, 1-2, 1-3. The load is, for example, a motor generator that is used for a hybrid vehicle or electric vehicle. When the motor generator is used as an electric motor, the electric motor is driven by a voltage stored in the battery module. When, on the other hand, the motor generator is used as a power generator, the electrical power generated by the power generator is stored in the battery module.

The cell controller 2 may be composed of a plurality of parts, such as a microcomputer IC, which serves as a computation section; a voltage regulator IC, which generates a supply voltage; a crystal or ceramic resonator part, which generates a clock; an analog-to-digital conversion part, which is a part of a voltage detection section; and a part for generating a reference voltage for the analog-to-digital conversion part. However, these parts can be integrated into a single chip or SiP (System in Package) to reduce the number of parts so that a single semiconductor device (IC) includes the voltage detection section, communication section, computation section, and other sections required for the cell controller. Similarly, a voltage detection section, current detection section, communication section, computation section, and other sections required for the battery controller can be integrated into a single semiconductor device (IC).

The configuration of the cell controller 2 for use in the battery apparatus according to the present embodiment will now be described with reference to FIG. 2.

Figure 2:
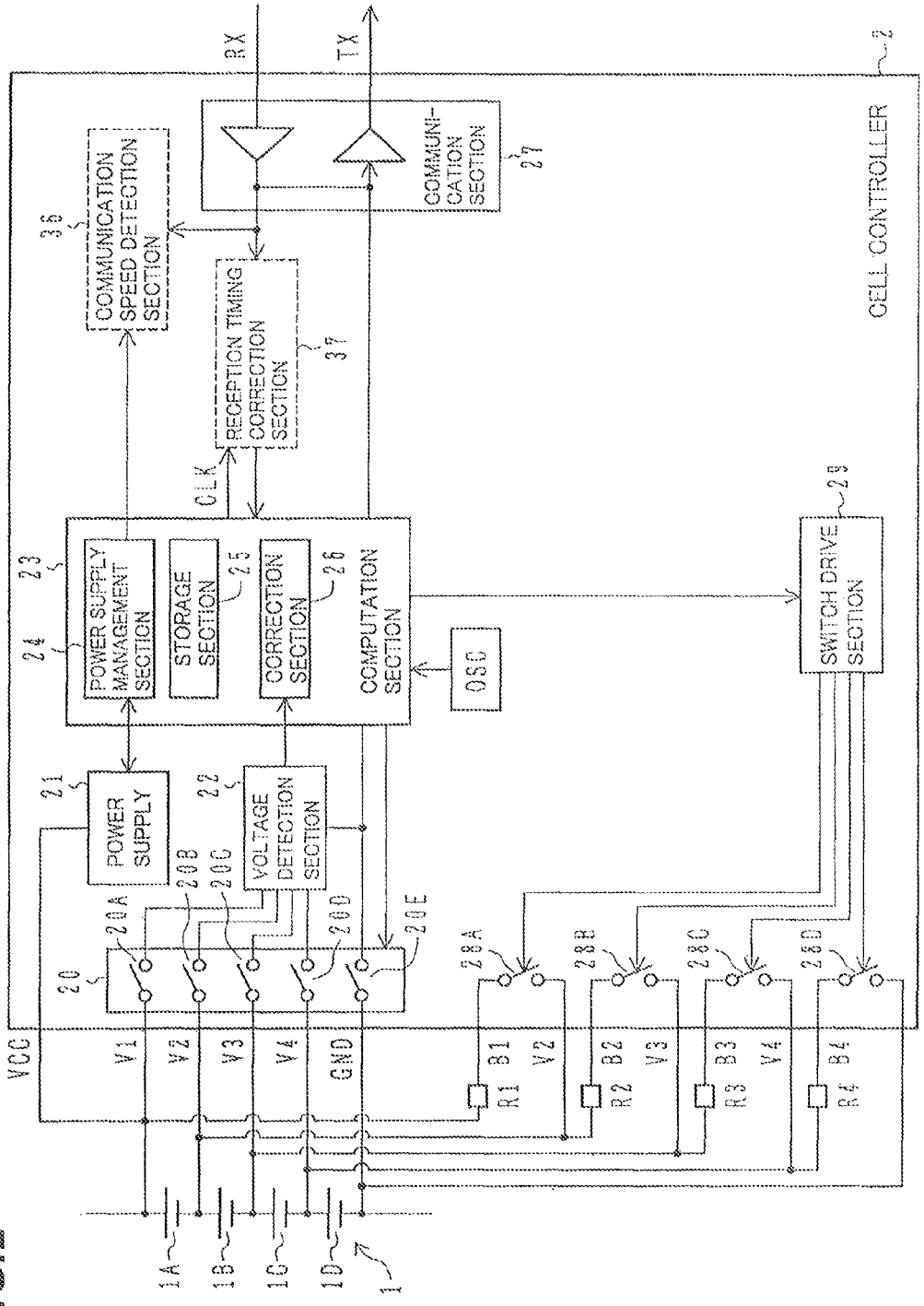
FIG. 2 is a block diagram illustrating the configuration of a cell controller for use in the battery apparatus according to an embodiment of the present invention.

FIG. 2 is a block diagram illustrating the configuration of the cell controller for use in the battery apparatus according to an embodiment of the present invention. Elements shown in FIGS. 1 and 2 are designated by the same reference numerals when they are identical with each other. In FIG. 2, the cell controllers 2-1, 2-2, 2-3 shown in FIG. 1 are collectively depicted as the cell controller 2 because they have the same configuration. The cell controller 2 is composed of a single semiconductor device (cell controller IC). Further, the unit battery cells 1-1, 1-2, 1-3 shown in FIG. 1 are collectively depicted as the unit battery cell 1 because they have the same configuration. The unit battery cell 1 is composed of battery cells 1A, 1B, 1C, 1D.

Referring to FIG. 2, the positive terminal for battery cell 1A of the unit battery cell 1 is connected to a selection section 20 through input terminal V1. The selection section 20 is composed, for instance, of a multiplexer. The selection section 20 includes switches 20A, 20B, 20C, 20D, 20E. One terminal of switch 20A is connected to input terminal V1, whereas the other terminal of switch 20A is connected to a voltage detection section 22. Further, one terminal of switch 20B for the selection section 20 is connected to the negative terminal for battery cell 1A of the unit battery cell 1, that is, the positive terminal for battery cell 1B, through input terminal V2, whereas the other terminal of switch 20B is connected to the voltage detection section 22.

One terminal of switch 20C for the selection section 20 is connected to the negative terminal for battery cell 1B of the unit battery cell 1, that is, the positive terminal for battery cell 1C, through input terminal V3, whereas the other terminal of switch 20C is connected to the voltage detection section 22. Further, one terminal of switch 20D for the selection section 20 is connected to the negative terminal for battery cell 1C of the unit battery cell 1, that is, the positive terminal for battery cell 1D, through input terminal V4, whereas the other terminal of switch 20D is connected to the voltage detection section 22.

One terminal of switch 20E for the selection section 20 is connected to the negative terminal for battery cell 1D of the unit battery cell 1 through a GND (ground) terminal, whereas the other terminal of switch 20E is connected to the voltage detection section 22.

A power supply 21 includes, for instance, a DC/DC converter that uses input terminal VCC as its input terminal. The power supply 21 converts the electrical power of the unit battery cell 1 to a predetermined voltage and supplies drive power to circuits within the cell controller IC chip.

The voltage detection section 22 detects the terminal-to-terminal voltages between the battery cells 1A, 1B, 1C, 1D of the unit battery cell 1. The detected terminal-to-terminal voltages between the battery cells 1A, 1B, 1C, 1D are output to a computation section 23.

The computation section 23 includes a power supply management section 24, a storage section 25, and a correction section 26. The power supply management section 24 provides ON/OFF control over the power supply 21. The storage section 25 stores the terminal-to-terminal voltages between the battery cells 1A, 1B, 1C, 1D of the unit battery cell 1, which are detected by the voltage detection section 22, on an individual battery cell basis. The correction section 26 corrects the terminal-to-terminal voltages between the battery cells 1A, 1B, 1C, in of the unit battery cell 1, which are detected by the voltage detection section 22.

A communication section 27 is connected to the computation section 23. The communication section 27 receives a communication command (a High or Low level signal made, for instance, of 8, 10, or 12 bits), which is transmitted from the battery controller 3 to an RX terminal through the insulation section 4A. In other words, the battery controller 3 transmits a communication command for reading the voltages between the battery cells 1A, 1B, 1C, 1D, a communication command for adjusting the voltages between the battery cells 1A, 1B, 1C, 1D of a particular unit battery cell 1, or other command for operating a particular cell controller 1C to the insulation section 4A. The insulation section 4A does not directly transmit the communication command input from the battery controller 3 but insulates it before transmitting it to the communication section 27. The insulation section 4A includes, for instance, a photocoupler IC and requires a power supply.

The positive terminal for battery cell 1A of the unit battery cell 1 is connected to a B1 terminal through a resistor R1. A balancing switch 28A, which is series-connected to the resistor R1, is inserted and connected across the terminals of battery cell 1A of the unit battery cell 1.

The positive terminal for battery cell 1B of the unit battery cell 1 is connected to a B2 terminal through a resistor R2. A balancing switch 28B, which is series-connected to the resistor R2, is inserted and connected across the terminals of battery cell 1B of the unit battery cell 1.

The positive terminal for battery cell 1C of the unit battery cell 1 is connected to a B3 terminal through a resistor R3. A balancing switch 28C, which is series-connected to the resistor R3, is inserted and connected across the terminals of battery cell 1C of the unit battery cell 1.

The positive terminal for battery cell 1D of the unit battery cell 1 is connected to a B4 terminal through a resistor R4. A balancing switch 28D, which is series-connected to the resistor R4, is inserted and connected across the terminals of battery cell 1D of the unit battery cell 1.

The balancing switches 28A, 28B, 28C, 28D discharge the series-connected battery cells 1A, 1B, 1C, 1D, which constitute the unit battery cell 1, and short-circuit the four battery cells 1A, 1B, 1C, 1D through the resistors R1, R2, R3, R4 to equalize the voltages of the battery cells. A switch drive section 29 turns on/off the balancing switches 28A, 28B, 28C, 28D in accordance with a command from the computation section 23.

The configuration of the battery controller 3 for use in the battery apparatus according to the present embodiment will now be described with reference to FIG. 3.

Figure 3:
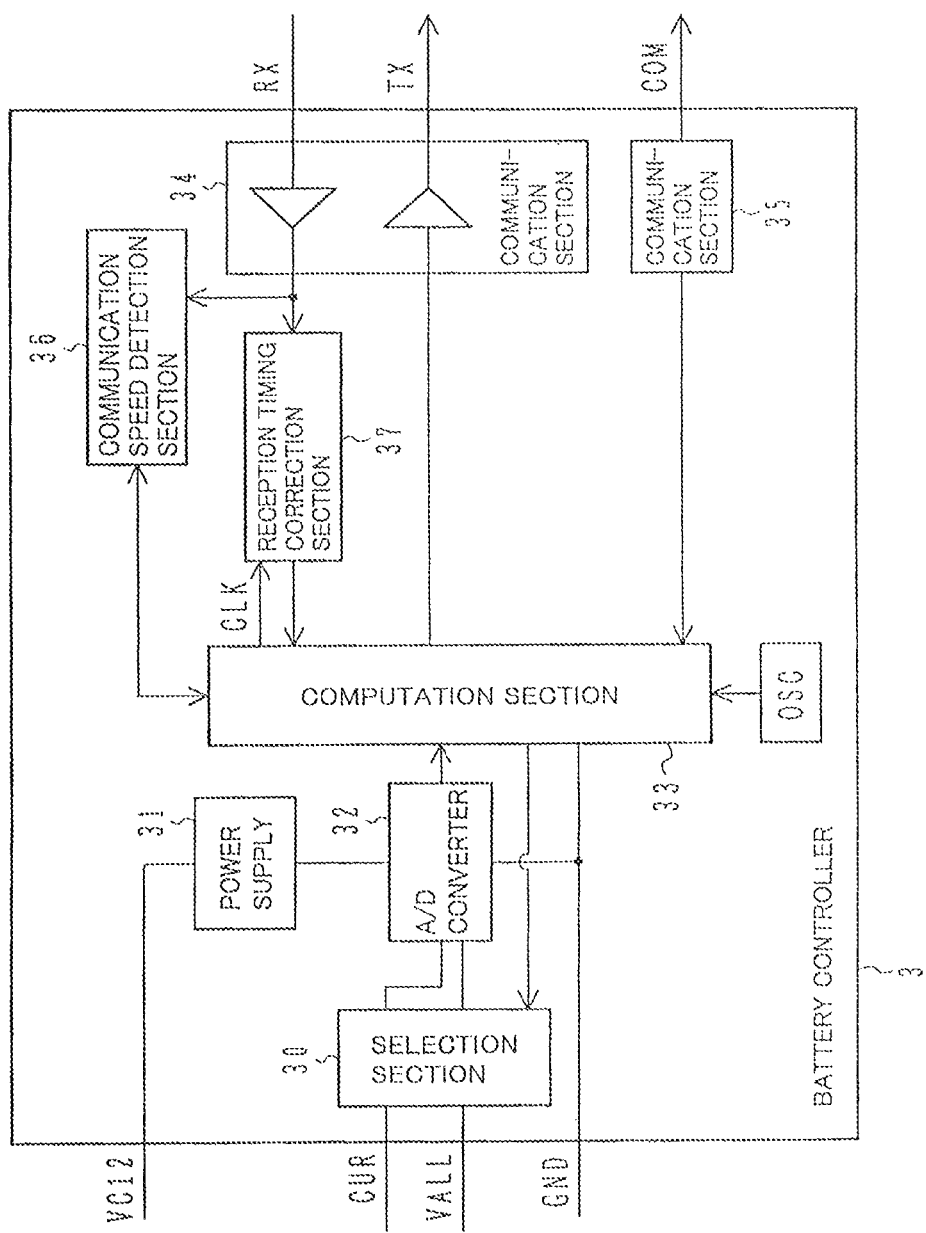
FIG. 3 is a block diagram illustrating the configuration of a battery controller for use in the battery apparatus according to an embodiment of the present invention.

FIG. 3 is a block diagram illustrating the configuration of the battery controller for use in the battery apparatus according to an embodiment of the present invention. Elements shown in FIGS. 1 and 3 are designated by the same reference numerals when they are identical with each other. The battery controller 3 is made of a single semiconductor device (battery controller IC).

A selection section 30 selects a current and overall voltage of the assembled battery, which are detected by the current detection section 7 and voltage measurement section 6 shown in FIG. 1. An A/D (analog-to-digital) converter 32 converts the selected current or overall voltage of the assembled battery to a digital signal and outputs the digital signal to the computation section 33. The computation section 33 processes the received measured data and transmits the processed data to a higher-level system through a communication section 35. As regards a hybrid vehicle, for example, the higher-level system is a vehicle controller, motor controller, or other higher-level controller that uses a battery in accordance with its status.

A communication speed detection section 36 acquires serial communication data received by a communication section 34, and detects the prevailing communication speed. The computation section 33 varies the cycle of a clock signal CLK, which is to be output to a reception timing correction section 37, in accordance with the communication speed detected by the communication speed detection section 36. The clock signal CLK defines the reception timing for the serial communication data. The reception timing correction section 37 reads received data with the timing of an input variable clock CLK. The communication speed detection section 36 will be described in detail with reference to FIGS. 6 and 7.

The communication section 35 includes a CAN, LIN (Local Interconnect Network), UART, Bluetooth, or other serial signal communication circuit or a photocoupler, relay, or other ON/OFF signal communication circuit.

A power supply 31 receives an electrical power input from a terminal VC12 and supplies electrical power to the inside of the battery controller IC.

Serial communication between the battery controller and cell controllers of the battery apparatus according to the present embodiment will now be described with reference to FIGS. 4, 5A, and 5B.

Figure 4:
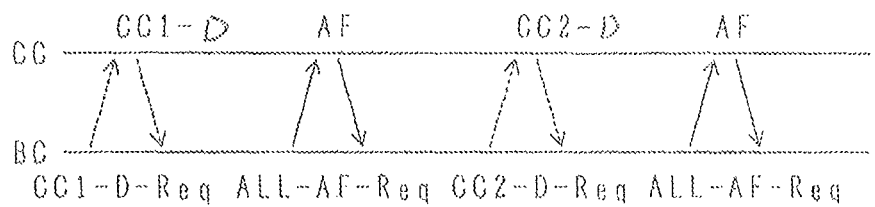
FIG. 4 is a diagram illustrating the serial communication between the battery controller and cell controllers of the battery apparatus according to an embodiment of the present invention.

FIG. 4 is a diagram illustrating the serial communication between the battery controller and cell controllers of the battery apparatus according to an embodiment of the present invention. FIGS. 5A and 5B illustrate the data configuration of the serial communication between the battery controller and cell controllers of the battery apparatus according to an embodiment of the present invention.

First of all, the battery controller 3 transmits a data acquisition request CC1-D-Req to cell controller 2-1 as shown in FIG. 4. In response to the request, cell controller 2-1 transmits acquired data CC1-D to the battery controller 3. The data CC1-D includes temperature and other measured data in addition to the battery voltages of the cell batteries 1A, 1B, 1C, 1D managed by the cell controller 2-1.

Next, the battery controller 3 transmits an abnormality flag acquisition request ALL-AF-Req to all the cell controllers 2-1, 2-2, 2-3. In response to the request, all the cell controllers 2-1, 2-2, 2-3 transmit acquired abnormality flags AF to the battery controller 3. The abnormality flag includes information about the existence of abnormality (overcharge or overdischarge) in the cell batteries 1A, 1B, 1C, 1D.

Next, the battery controller 3 transmits a data acquisition request CC2-D-Req to cell controller 2-2 In response to the request, cell controller 2-2 transmits acquired data CC2-D to the battery controller 3.

Next, the battery controller 3 transmits an abnormality flag acquisition request ALL-AF-Req to all the cell controllers 2-1, 2-2, 2-3. In response to the request, all the cell controllers 2-1, 2-2, 2-3 transmit acquired abnormality flags AF to the battery controller 3.

As described above, a process is repeated to sequentially transmit a data acquisition request to one cell controller after another and transmit an abnormality flag acquisition request to all the cell controllers between each data acquisition request transmission.

As described above, the information about the existence of abnormality (overcharge or overdischarge) in the cell batteries can be acquired while acquiring the voltage, temperature, and other measured data about the cell batteries, which are acquired by the cell controllers. As a result, the battery controller can detect the existence of abnormality in the cell batteries, which is of an urgent concern, while exercising battery control in consideration of the influence of internal resistance variations based on the acquisition of individual cell battery voltages.

In the past, when at least one of a plurality of cell voltages was higher or lower than a predetermined value related to a cell battery overcharge or overdischarge, each cell controller transmitted an abnormality flag to the battery controller. Therefore, the existence of abnormality (overcharge or overdischarge) in the cell batteries could be indicated by at least one transmission/reception through a serial communication line. However, individual cell battery voltages could not be acquired simply by acquiring the abnormality flag. This made it impossible to exercise battery control in consideration of the influence of internal resistance variations of the cell batteries. However, this problem can be solved by acquiring individual cell battery voltages while acquiring the information about the existence of cell battery abnormality between each cell battery voltage acquisition, as described above.

Figure 5A:
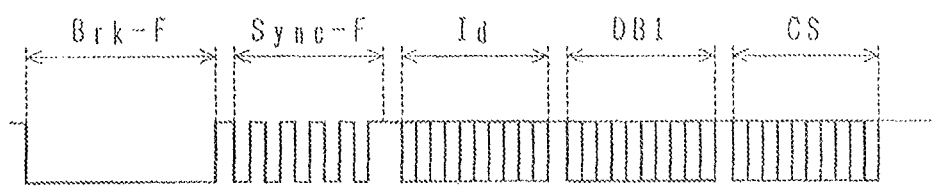
FIGS. 5A and 5B illustrate the data configuration of the serial communication between the battery controller and cell controllers of the battery apparatus according to an embodiment of the present invention.

FIG. 5A shows the data configuration of a serial transmission from the battery controller 3 to the cell controllers 2-1, 2-2, 2-3. A data transmission from the battery controller 3 includes a break field Brk-F, a synchronous field Sync-F, an identifier Id, a data byte DB1, and a checksum CS.

The break field Brk-F is a field that indicates the beginning of a data transmission. This field is made of a Low-level signal that persists for a predetermined period of time.

The synchronous field Sync-F is a signal in which a Low-level signal and High-level signal alternate. This field is used to achieve data synchronization.

The identifier Id is data that identifies a cell controller (2-1, 2-2 or 2-3) to which an inquiry is addressed. A unique ID number is assigned to each cell controller (2-1, 2-2 or 2-3) and written in the identifier Id. An ID number for simultaneously issuing an inquiry to all the cell controllers 2-1, 2-2 or 2-3 is also predetermined.

The data byte DB1 is data that describes an inquiry. It is used, for instance, to demand a cell battery voltage managed by cell controller 2-1 or demand information about the existence of an abnormality flag in all the cell controllers.

The checksum CS is a parity bit or other similar information that is used to check the data to be transmitted.

Figure 5B:
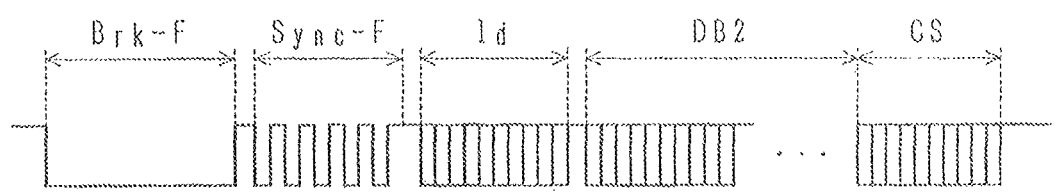

FIG. 5B shows the data configuration of a serial transmission from the cell controllers 2-1, 2-2, 2-3 to the battery controller 3. A data transmission from the cell controllers 2-1, 2-2, 2-3 includes a break field Brk-F, a synchronous field Sync-F, an identifier Id, a data byte DB2, and a checksum CS. The break field Brk-F, synchronous field Sync-F, and identifier Id are the duplicates of data transmitted from the battery controller 3.

The data byte DB2 includes data about an inquiry transmitted from the battery controller 3 as well as a cell battery voltage and data about the existence of an abnormality flag, which constitute a response to the transmitted inquiry.

The checksum CS is a parity bit or other similar information that is used to check the data to be transmitted.

The operations of the communication speed detection section 36 and reception timing correction section 37 for use in the battery controller of the battery apparatus according to the present embodiment will now be described with reference to FIG. 6.

FIG. 6 illustrates the operation of the communication speed detection section for use in the battery controller of the battery apparatus according to an embodiment of the present invention. FIGS. 7A and 7B illustrate the operation of the reception timing correction section for use in the battery controller of the battery apparatus according to an embodiment of the present invention.

The communication speed detection section 36 focuses attention on the synchronous field Sync-F within the data input from the input terminal RX and measures the lengths of High-level time and Low-level time.

For example, the communication speed detection section 36 measures High-level time lengths as $t_{H1}$, $t_{H2}$, $t_{H3}$, and $t_{H4}$ and Low-level time lengths as $t_{L1}$, $t_{L2}$, $t_{L3}$, and $t_{L4}$, as shown in FIG. 6. Then, the communication speed detection section 36 calculates the average value $t_H$ of the High-level time lengths and the average value $t_L$ of the Low-level time lengths. Further, the communication speed detection section 36 calculates a cycle $t=t_H+t_L$ from the sum of the High- and Low-level average time lengths. The cycle t is transmitted to the computation section 33.

If, for instance, the cycle of inquiry data transmitted from the battery controller 3 is 19.2 kbps, one data cycle is 52 µs.

The computation section 33 uses the data having a cycle of t, which is obtained from the communication speed detection section 36, to vary the cycle of the clock signal CLK to be transmitted to the reception timing correction section 37.

The operation of the reception timing correction section 37 will now be described with reference to FIGS. 7A and 7B.

FIG. 7A shows a data signal that is input from the input terminal RX, output from the communication section 34, and input to the reception timing correction section 37. FIG. 7B shows a clock signal CLK that is output from the computation section 33 and input to the reception timing correction section 37.

If, for instance, the data cycle t detected by the communication speed detection section 36 is 50 µs although the primary data cycle is 52 µs, the computation section 33 ensures that the clock signal to be output has a cycle t of 50 µs. As shown in FIG. 7B, the clock signal CLK alternates between High and Low and has a cycle of t.

The reception timing correction section 37 acquires an input data signal shown in FIG. 7A at the instant at which the clock signal CLK goes High. In the example shown in FIGS. 7A and 7B, therefore, L, L, L, H, H, and L signals are sequentially read. The read signals enter the computation section 33.

In a situation where the plurality of cell controllers 2-1, 2-2, 2-3 and the battery controller 3 are daisy-chained to form a serial communication configuration (serial lines SL1 to SL8) as shown in FIG. 1, the speed differences between serial communication lines SL1 to SL8 increase due to the series connection of the plurality of cell controllers 2-1, 2-2, 2-3. Therefore, when a serial communication signal returns to the battery controller, its communication speed differs from the communication speed of a transmission from the battery controller to the cell controllers. This may cause an erroneous bit read and reception error.

However, the present embodiment can establish proper serial communication because it uses the communication speed detection section 36, computation section 33, and reception timing correction section 37 to exercise a communication speed correction function.

The communication speed detection section 36 and reception timing correction section 37 may alternatively be incorporated in each cell controller 2 as indicated by broken lines in FIG. 2.

The configuration of a hybrid vehicle in which the battery apparatus according to the present embodiment is mounted will now be described with reference to FIG. 8.

Figure 8:
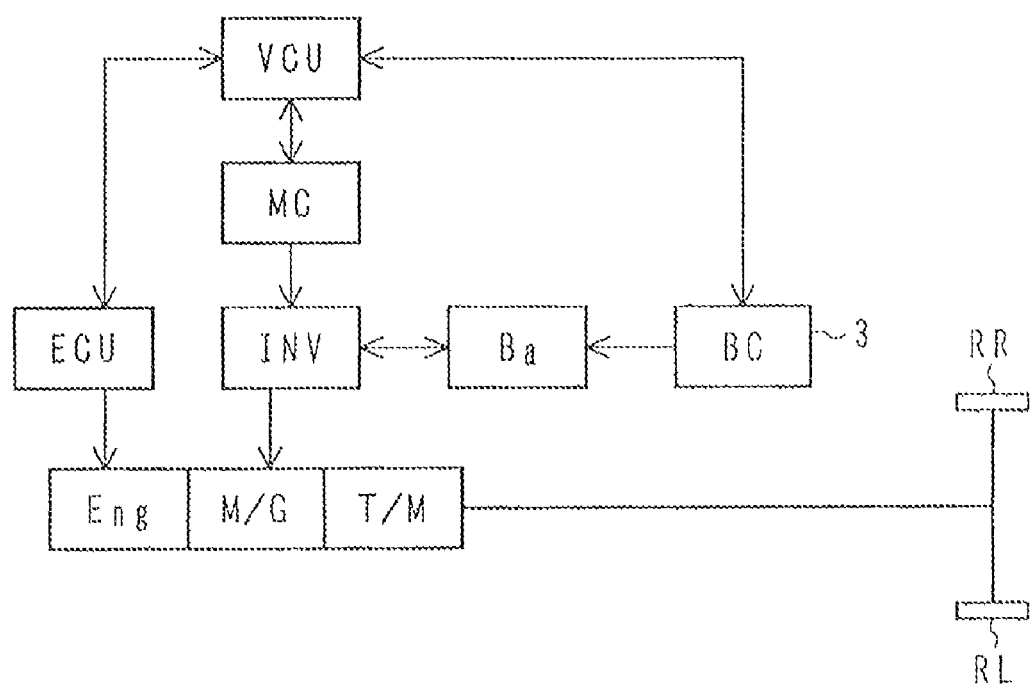
FIG. 8 is a system block diagram illustrating the configuration of a hybrid vehicle in which the battery apparatus according to an embodiment of the present invention is mounted.

FIG. 8 is a system block diagram illustrating the configuration of a hybrid vehicle in which the battery apparatus according to an embodiment of the present invention is mounted.

The hybrid vehicle includes an engine ENG, which is a first driving power source, and a motor generator M/G, which is a second driving power source. The motor generator M/G not only operates as a driving power source, but also operates as a power generator. Driving power generated from the engine ENG and motor generator M/G is subjected to shifting by a transmission T/M, conveyed to rear wheels RR, RL, and used to drive the rear wheels RR, RL.

The driving power to be generated by the engine ENG is controlled by an engine control unit ECU. The engine control unit ECU controls, for instance, a fuel injection amount, fuel injection timing, and ignition timing in accordance with the amount of air taken into the engine ENG.

The motor generator M/G is, for instance, a three-phase synchronous motor. When the motor generator M/G is to be operated as a motor, the electrical power stored in a battery Ba is converted from DC power to three-phase AC power by an inverter INV and supplied to the motor generator M/G. When the motor generator M/G is to be operated as a power generator, the electrical power generated by the motor generator M/G is converted from three-phase AC power to DC power by the inverter INV and stored in the battery Ba. A motor controller MC controls the operation of the inverter INV.

The battery Ba is configured so that a plurality of battery cells are series-connected as shown in FIG. 1. For example, four battery cells constitute one unit and form a unit battery cell. A cell controller (CC) is provided for the unit battery cell. The cell controller monitors the unit battery cell 1-1.

The battery controller (BC) 3 is configured as shown in FIG. 2. It monitors the status of the battery Ba through the cell controller.

A vehicle control unit VCU exercises integrated control over the engine control unit ECU, motor controller MC, and battery controller (BC) 3.

In a situation where the plurality of cell controllers and the battery controller are daisy-chained to form a serial communication configuration, the present embodiment can establish proper serial communication and provide enhanced communication reliability because the battery controller has the communication speed correction function as described above.

Further, when the cell controllers and the battery controller are daisy-chained to form a serial communication configuration, the battery controller can detect the existence of abnormality in the cell batteries, which is of an urgent concern, while exercising battery control in consideration of the influence of internal resistance variations in the cell batteries because the information about the existence of abnormality (overcharge or overdischarge) in the cell batteries is acquired while acquiring the voltage, temperature, and other measured data about the cell batteries, which are obtained by the cell controllers. This makes it possible to provide enhanced battery system reliability and extended battery life.

The present invention is intended for use with a power supply system that includes an assembled battery composed of a plurality of unit cells. Therefore, it can be not only used in vehicles such as hybrid vehicles and electric vehicles, but also used for various other applications.

What is claimed is:

1. A battery apparatus comprising:
   a battery module in which a plurality of unit battery cells are series-connected while a plurality of battery cells are series-connected electrically in each of the unit battery cells;
   first control apparatuses, one of which is provided for each of the plurality of unit battery cells and is connected electrically to the plurality of battery cells of the associated unit battery cell;
   a first signal transmitting path, which is constructed by connecting said first control apparatuses electrically, and which transmits a signal serially between said first control apparatuses;
   a second control apparatus; and
   a second signal transmitting path, which provides an insulating means for insulating an electrical connection, and which transmits a signal through said insulating means between the first control apparatuses and said second control apparatus which are connected electrically and serially;
   wherein the signal which transmits through said first transmitting path and said second transmitting path provides a plurality of areas including a synchronous field and data byte, and a serial data signal including a plurality of signals having high levels and low levels;
   wherein at least one of each of the first control apparatuses and said second control apparatus comprises
      a speed detection section for detecting the speed of the serial data signal from the signal which is written in the synchronous field of the serial data signal which is input from an additional control apparatus,
      a reception timing defining section for defining the reception timing for the serial data signal in accordance with the speed detected by the speed detection section, and
      a signal reading section for reading in the serial data signal at the timing of the reception timing defining signal.

2. A battery apparatus according to claim 1,
   wherein the speed detection section calculates an average time of the high level and an average time of the low level in the synchronous field of the serial data signal, calculates a period of the serial data signal from the sum of the average time of the high level and the average time of the low level, and outputs the calculated period of the serial data signal to a receiving timing defining signal output section.

3. A battery apparatus according to claim 2,
   wherein the receiving timing defining signal output section outputs a receiving timing defining signal which has the same period as the period of the serial data signal output from the speed detection section, and
   wherein the receiving timing defining signal is a repeating signal of high levels and low levels, and is constructed by a plurality of high levels and low levels.

4. A battery apparatus according to claim 3,
   wherein the signal reading section reads in the serial data signal at a stand-up timing of a high level signal of the receiving timing defining signal.

5. A battery apparatus according to claim 1,
   wherein the first control apparatuses detect voltages and abnormality of the plurality of battery cells in the corresponding unit battery cells, respectively, and
   wherein the second control apparatus writes in a command for requesting the acquisition of the voltage of the plurality of battery cells, which are detected by the first control apparatuses, respectively, or a command for requesting the acquisition of the abnormal flag of the plurality of battery cells, which are detected by the first control apparatuses, respectively, into a data byte of the serial data, and outputs to the second signal transmitting path.

6. A battery apparatus according to claim 5,
wherein the second control apparatus outputs the serial data signal in which the command for requesting the acquisition of the voltage of the plurality of battery cells is written into the data byte to the first control apparatuses sequentially, and
outputs the serial data signal in which the command for requesting the acquisition of the abnormal flag of the plurality of battery cells to all of the first control apparatuses is written into the data byte, after transmitting the serial data signal in which the command for requesting the acquisition of the voltage of one of the battery cell written into the data byte, and during transmitting the serial data signal in which the command for requesting the acquisition of the voltage of the next battery cell written into the data byte,
wherein each of the first control apparatuses outputs a signal in which a data of the respective voltage relating the plurality of battery cells of the corresponding unit battery cells in accordance with the serial data signal in which the command for requesting the acquisition of the abnormal flag of the plurality of battery cells to all of the first control apparatuses is written into the data byte of the received data signal to the first signal transmitting path or the second signal transmitting path, respectively, and
each of the first control apparatuses outputs a signal in which an abnormal flag which indicates an abnormal state of the plurality of battery cells of the corresponding unit battery cells in accordance with the serial data signal in which the command for requesting the acquisition of the abnormal flag of the plurality of battery cells to all of the first control apparatuses is written into the data byte of the received data signal to the first signal transmitting path or the second signal transmitting path, and
wherein the second control apparatus inputs the serial data signal in which the data relating the voltage of the battery cell is written into the data byte and the serial data signal in which the abnormal flag indicating the abnormal state of the battery cell is written into the data byte alternatively from the second signal transmitting path.

7. A battery apparatus according to claim 1,
wherein each of the first control apparatuses is constructed by an integrated circuit.

8. A battery apparatus according to claim 1,
wherein a circular signal transmitting path is constructed by the first signal transmitting path and the second signal transmitting path.

9. A battery apparatus according to claim 1,
wherein the serial data signal provides an area of an identifier in which an information of an ID number for specifying one of the first control apparatuses.

10. A cell control apparatus installed in a battery apparatus having a battery module in which a plurality of unit battery cells are series-connected while a plurality of battery cells are series-connected electrically in each of the unit battery cells and a battery control apparatus, the cell control apparatus communicating with the battery control apparatus through a signal transmitting path having an insulating means for insulating an electrical connection,
wherein the cell control apparatus comprises
integrated circuits which are provided for each of the plurality of unit battery cells and are connected electrically to the plurality of battery cells of the associated unit battery cells; and
a signal transmitting path, which is constructed by connecting said first control apparatuses electrically, and which transmits a signal serially between said first control apparatuses;
wherein the signal which transmits through said first transmitting path and said second transmitting path provides a plurality of areas including a synchronous field and data byte, and a serial data signal which is constructed by a plurality of signals having high levels and low levels;
wherein the plurality of integrated circuits comprises
a speed detection section for detecting the speed of the serial data signal from the signal which is written in the synchronous field of the serial data signal which is input from an additional control apparatus,
a speed detection section for detecting the speed of the serial data signal from the signal which is written in the synchronous field of the serial data signal which is input from an additional control apparatus,
a reception timing defining section for defining the reception timing for the serial data signal in accordance with the speed detected by the speed detection section, and
a signal reading section for reading in the serial data signal at the timing of the reception timing defining signal.

11. A cell control apparatus according to claim 10,
wherein the speed detection section calculates an average time of the high level and an average time of the low level in the synchronous field of the serial data signal, calculates a period of the serial data signal from the sum of the average time of the high level and the average time of the low level, and outputs the calculated period of the serial data signal to a receiving timing defining signal output section.

12. A cell control apparatus according to claim 11,
wherein the receiving timing defining signal output section outputs a receiving timing defining signal which has the same period as the period of the serial data signal output from the speed detection section, and
wherein the receiving timing defining signal is a repeating signal of high levels and low levels, and is constructed by a plurality of high levels and low levels.

13. A cell control apparatus according to claim 12,
wherein the signal reading section reads in the serial data signal at a stand-up timing of a high level signal of the receiving timing defining signal.

14. A plurality of integrated circuits, one of which is provided for each of a plurality of unit battery cells and is connected electrically to the plurality of battery cells of the associated unit battery cell, is series-connected with the other integrated circuit while a plurality of battery cells are series-connected electrically in each of the unit battery cells, and the plurality of the integrated circuits are connected serially and electrically for constructing a signal transmitting path for transmitting a serial data signal which has a plurality of areas including a synchronous field and data byte, and a serial data signal which constructed by a plurality of signals having high levels and low levels;
wherein the integrated circuit comprises
a plurality of voltage input terminals for inputting voltages of the plurality of battery cells connected electrically,
a selecting section for selecting the plurality of voltages inputted from the plurality of the voltage input terminals and outputs the selected voltages,
a voltage detecting section for detecting the voltage which is output from the selecting section, a signal input terminal for inputting the serial data signal, a signal output terminal for outputting the serial data signal, a communicating section for receiving the serial data signal input from the signal input terminal, a speed detection section for detecting the speed of the serial data signal from the signal which is written in the synchronous field of the serial data signal which is input from an additional control apparatus, a reception timing defining section for defining the reception timing for the serial data signal in accordance with the speed detected by the speed detection section, and a signal reading section for reading in the serial data signal at the timing of the reception timing defining signal.

15. An integrated circuit according to claim 14, wherein the speed detection section calculates an average time of the high level and an average time of the low level in the synchronous field of the serial data signal, calculates a period of the serial data signal from the sum of the average time of the high level and the average time of the low level, and outputs the calculated period of the serial data signal to a receiving timing defining signal output section.

16. An integrated circuit according to claim 15, wherein the receiving timing defining signal output section outputs a receiving timing defining signal which has the same period as the period of the serial data signal output from the speed detection section, and wherein the receiving timing defining signal is a repeating signal of high levels and low levels, and is constructed by a plurality of high levels and low levels.

17. An integrated circuit according to claim 16, wherein the signal reading section reads in the serial data signal at a stand-up timing of a high level signal of the receiving timing defining signal.

* * * * *